(12) United States Patent
Fouts et al.

(10) Patent No.: US 7,761,254 B2
(45) Date of Patent: Jul. 20, 2010

(54) OPERATOR INTERFACE ASSEMBLY INCLUDING A HALL EFFECT ELEMENT AND MACHINE USING SAME

(75) Inventors: Stephen Fouts, Washington, IL (US); Matthew Vande Wiele, Peoria, IL (US); Rex Glover, Deer Creek, IL (US); Curtis Johnson, Peoria, IL (US); Kenneth Her, Peoria, IL (US); Roger Obourn, Washington, IL (US); Dan Shearer, Metamora, IL (US)

(73) Assignee: Caterpillar Inc, Peoria, IL (US)

( * ) Notice: Subject to any disclaimer, the term of this patent is extended or adjusted under 35 U.S.C. 154(b) by 536 days.

(21) Appl. No.: 11/801,996

(22) Filed: May 11, 2007

(65) Prior Publication Data

US 2008/0278218 A1 Nov. 13, 2008

(51) Int. Cl.
*H03K 3/59* (2006.01)
(52) U.S. Cl. ............... 702/115; 324/207.14; 324/207.2; 327/511; 700/302; 74/473.12; 74/335
(58) Field of Classification Search ................. 702/115; 324/207.14, 207.2, 207.24, 207.21, 207.22, 324/207.26, 207.23; 340/709; 327/511; 700/302; 74/473.12, 335
See application file for complete search history.

(56) References Cited

U.S. PATENT DOCUMENTS

| | | | |
|---|---|---|---|
| 4,425,620 A | 1/1984 | Batcheller et al. | |
| 4,610,179 A | 9/1986 | Parker | |
| 4,660,430 A | 4/1987 | Bortfeld et al. | |
| 4,825,157 A * | 4/1989 | Mikan | 324/207.2 |
| 4,914,376 A * | 4/1990 | Meyer | 323/352 |
| 5,160,918 A * | 11/1992 | Saposnik et al. | 345/161 |
| 5,307,013 A | 4/1994 | Santos et al. | |
| 5,370,015 A | 12/1994 | Moscatelli | |
| 5,406,860 A | 4/1995 | Easton et al. | |
| 5,660,079 A | 8/1997 | Friedrich | |
| 5,852,953 A | 12/1998 | Ersoy | |
| 5,861,796 A | 1/1999 | Benshoff | |
| 5,913,935 A | 6/1999 | Anderson et al. | |
| 6,205,874 B1 | 3/2001 | Kupper et al. | |
| 6,324,928 B1 * | 12/2001 | Hughes | 74/335 |
| 6,382,045 B1 | 5/2002 | Wheeler | |
| 6,456,025 B2 * | 9/2002 | Berkowitz et al. | 318/272 |
| 6,530,293 B1 | 3/2003 | Ruckert et al. | |
| 6,550,351 B1 * | 4/2003 | O'Reilly et al. | 74/335 |
| 6,658,960 B2 | 12/2003 | Babin et al. | |

(Continued)

*Primary Examiner*—Carol S Tsai
(74) *Attorney, Agent, or Firm*—Liell & McNeil

(57) ABSTRACT

A machine having an operator interface for requesting an action from an actuator of the machine includes a movable component of the operator interface. The movable component is movable among at least two positions. One of a magnet and a Hall effect sensor is positioned to move in response to movement of the movable component. The other of the magnet and the Hall effect sensor has a stationary position relative to the movable component. A pulse width modulator is operably coupled to the Hall effect sensor for producing a first pulse width modulated signal. The first pulse width modulated signal is altered in response to movement of one of the Hall effect sensor and the magnet relative to the other. An electronic controller is in communication with the pulse width modulator and the actuator and is configured to actuate the actuator in response to evaluation of the first pulse width modulated signal.

20 Claims, 3 Drawing Sheets

U.S. PATENT DOCUMENTS

| | | |
|---|---|---|
| 6,851,538 B2 | 2/2005 | Meyer et al. |
| 6,909,353 B2 * | 6/2005 | Romero Herrera et al. ... 338/32 H |
| 6,992,478 B2 | 1/2006 | Etherington et al. |
| 7,009,386 B2 | 3/2006 | Tromblee et al. |
| 7,394,173 B2 * | 7/2008 | Cope et al. .................... 310/15 |
| 2004/0164731 A1 | 8/2004 | Moreno |
| 2005/0035669 A1 * | 2/2005 | Bares et al. ................. 307/326 |
| 2006/0169084 A1 | 8/2006 | Meaney et al. |

* cited by examiner

OPERATOR INTERFACE ASSEMBLY INCLUDING A HALL EFFECT ELEMENT AND MACHINE USING SAME

TECHNICAL FIELD

The present disclosure relates generally to an operator interface assembly including a Hall effect element, and more particularly to actuating an actuator with an electronic controller based on a position of a movable component of the operator interface assembly.

BACKGROUND

Directional controllers of machines have traditionally included an operator interface or switch assembly connected to the transmission of the machine through a mechanical linkage. Specifically, a shift lever, or other similar device, is pivotally mounted to a base and is movable through one of various gear positions, such as forward, neutral, and reverse. More recently, however, contact type switches are being used to detect the selected gear position and use this position information to electronically facilitate a change in gear position via commands from an electronic controller.

In either arrangement, contact type switches are typically employed to detect the selected gear position of the shift lever and transmit the information to a controller of the machine. The controller of the machine may use this information for various purposes and may transmit the information to various subsystems of the machine. Contact switches, however, require physical contact to produce an electrical signal. Unfortunately, the contacts on these switches may become corroded or worn with use or, alternatively, the contacts may no longer form an acceptable electrical connection after repetitive use. Replacing such switches may be difficult and expensive, and may also require a significant period of downtime for the machine.

In order to avoid the problems associated with contact type switches, switches have been developed that incorporate contactless sensors. Hall effect switches are well known contactless switches, especially in the position and motion sensing fields, for providing improved life expectancy compared to the traditional, contact type switch assemblies. As shown in U.S. Pat. No. 6,550,351, a driver interface in the form of a shift lever is provided. The position of the shift lever is sensed using a plurality of discrete position Hall effect sensors and a rotational position Hall effect sensor. The output of the sensors is directed to an electronic control module, which determines the selected position and energizes a transmission actuator to change a gear position of the transmission. This reference, however, does not contemplate a sensor configuration that remains robustly reliable in the presence of electromagnetic interference.

The present disclosure is directed to one or more of the problems set forth above.

SUMMARY OF THE INVENTION

In one aspect, a machine having an operator interface for requesting an action from an actuator of the machine includes a movable component of the operator interface. The movable component is movable among at least two positions. One of a magnet and a Hall effect sensor is positioned to move in response to movement of the movable component. The other of the magnet and the Hall effect sensor has a stationary position relative to the movable component. A pulse width modulator is operably coupled to the Hall effect sensor for producing a first pulse width modulated signal. The first pulse width modulated signal is altered in response to movement of one of the Hall effect sensor and the magnet relative to the other. An electronic controller is in communication with the pulse width modulator and the electronic controller is configured to actuate the actuator in response to evaluation of the first pulse width modulated signal.

In another aspect, a method of actuating an actuator of a machine includes a step of moving a movable component of an operator interface of the machine to one of a first position and a second position. One of a magnet and a Hall effect sensor is positioned to move relative to the other in response to movement of the movable component. The method also includes a step of modulating a signal of the Hall effect sensor to produce a first pulse width modulated signal. The first pulse width modulated signal is altered in response to movement of one of the Hall effect sensor and the magnet relative to the other. The method also includes steps of transmitting the first pulse width modulated signal to an electronic controller of the machine, and determining the position of the movable component based on the first pulse width modulated signal. The method also includes a step of generating an actuator command signal from the electronic controller to the actuator based on the determined position.

In still another aspect, an operator interface assembly for actuating an actuator of a machine includes a first port for supplying power to the operator interface assembly, and a movable component of the operator interface. The movable component is movable among at least two positions. One of a magnet and a Hall effect sensor is positioned to move in response to movement of the movable component. The other of the magnet and the Hall effect sensor has a stationary position relative to the movable component. A pulse width modulator is operably coupled to the Hall effect sensor for producing a pulse width modulated signal. The pulse width modulated signal is altered in response to movement of one of the Hall effect sensor and the magnet relative to the other. A second port transmits the pulse width modulated signal from the pulse width modulator to an electronic controller of the machine.

DETAILED DESCRIPTION

Figure 1:
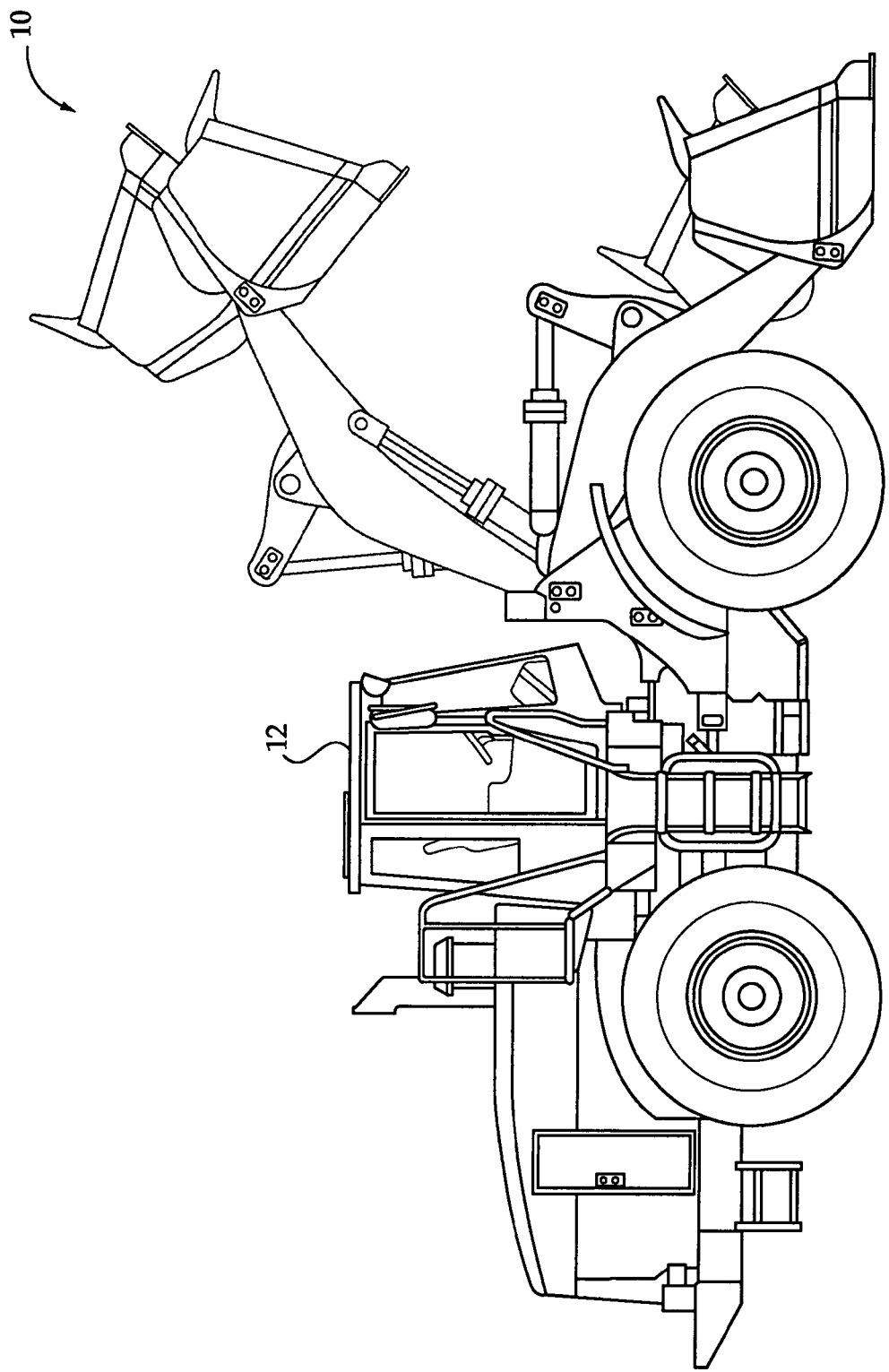
FIG. 1 is a side diagrammatic view of a machine according to the present disclosure.
Figure 2:
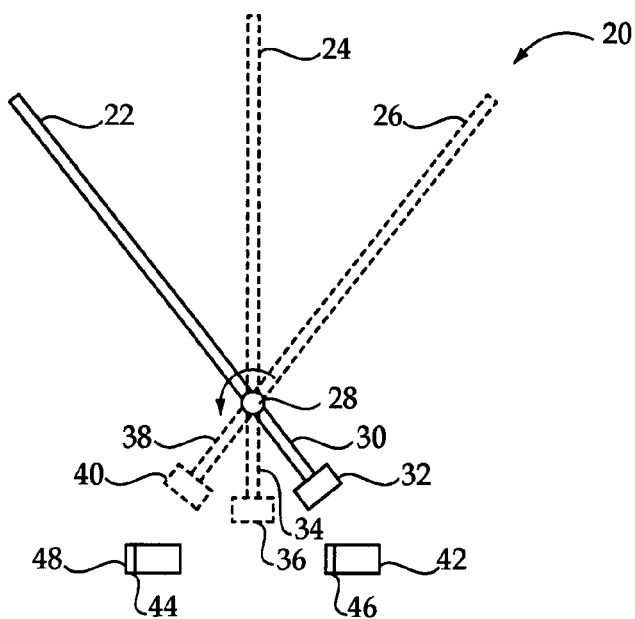
FIG. 2 is a diagrammatic view of an operator assembly of the machine of FIG. 1.

An exemplary embodiment of a machine 10 is shown generally in FIG. 1. The machine 10 may be a wheel loader, as shown, or any other vehicle utilizing an operator interface assembly as described herein. The machine 10 includes an operator control station 12. The operator control station 12 includes an operator interface assembly for controlling a direction of the machine 10, such as a forward, neutral, or reverse direction. The operator interface assembly is shown generally at 20 in FIG. 2.

The operator interface assembly 20 includes a movable component, such as, for example, a lever 22. Although a lever is shown, it should be appreciated that any type of movable component or switch may be utilized, such as, for example, a toggle switch, a push-button switch, or a rocker switch. The lever 22 or, more specifically, the machine directional controller, may be movable among two or more positions. As shown, lever 22 is movable among three positions. A forward position is shown, while a neutral position 24 and a reverse position 26 are both shown in phantom.

The lever 22 may be pivotally connected to a pivotable member 28 that swings a secondary lever 30 in response to movement of lever 22. A permanent magnet 32 is positioned to move in response to movement of the secondary lever 30. Specifically, the magnet 32 may be attached to the secondary lever 30 using any known method, such as, for example, adhering, welding, or bolting. Alternatively, the magnet 32 may be attached to the secondary lever 30 indirectly using one or more belts, chains, or gears. As another alternative, the magnet 32 may be directly attached to the lever 22.

As shown, the magnet 32 is positioned to represent selection of the forward position of lever 22 and secondary lever 30. For selection of the neutral position, represented by lever 24 and secondary lever 34 (both shown in phantom), the magnet 32 would be positioned as shown at 36 (in phantom). For selection of the reverse position, represented by lever 26 and secondary lever 38 (both shown in phantom), the magnet would be positioned as shown at 40 (in phantom). A first Hall effect sensor or element 42 and a second Hall effect sensor or element 44 are stationary relative to the magnet 32.

As should be appreciated, the magnet 32 will be positioned within close proximity to the first Hall effect sensor 42 at the forward position of the lever 22 and secondary lever 30. Alternatively, at the reverse position, represented by lever 26 and secondary lever 38 (both shown in phantom), the magnet (shown at 40) is positioned within close proximity to the second Hall effect sensor 44. Upon selection of the neutral position, represented by lever 24 and secondary lever 34 (both shown in phantom), the magnet (shown at 36) is positioned approximately equidistantly from both Hall effect sensors 42 and 44.

Although Hall effect sensors, namely sensors 42 and 44, are utilized, it should be appreciated by those skilled in the art that any type of contactless, magnetic sensor may be used to measure the position of lever 22. Generally, magnet 32 is used to create a magnetic field, which is measured by one or more magnetically sensitive features, such as Hall effect sensors 42 and 44. The changing magnetic field at the Hall effect sensors 42 and 44 is converted into an output signal proportional to the movement of the magnet 32 or the strength of the magnetic field at the sensor location.

A first pulse width modulator 46 is implemented as a portion of Hall effect sensor 42 and a second pulse width modulator 48 is implemented as a portion of Hall effect sensor 44. Each modulator 46 and 48, as generally practiced in the art, produces a square wave that is dependent upon the voltage supplied by the respective Hall effect sensors 42 and 44. Like conventional pulse width modulators, each modulator 44 and 48 consists, fundamentally, of an oscillator and a comparator (not shown), which are well known and may be of any suitable design.

Specifically, each modulator 46 and 48 may use an oscillator to produce a repetitive signal, such as, for example, a sine wave. A comparator may then be used to compare the sine wave to the output signal of each of the Hall effect sensors 42 and 44. The output of the comparator indicates which of the signals is larger. If the signal of the Hall effect sensor (42 or 44) is larger than the sine wave, the pulse width modulated signal is in the high state, otherwise it is in the low state. The duty cycle of the pulse width modulated signal is representative of the ratio between the pulse duration and the period. Since a pulse width modulated signal is time based rather than amplitude based, it is more resistant to electromagnetic interference than other signals.

Figure 3:
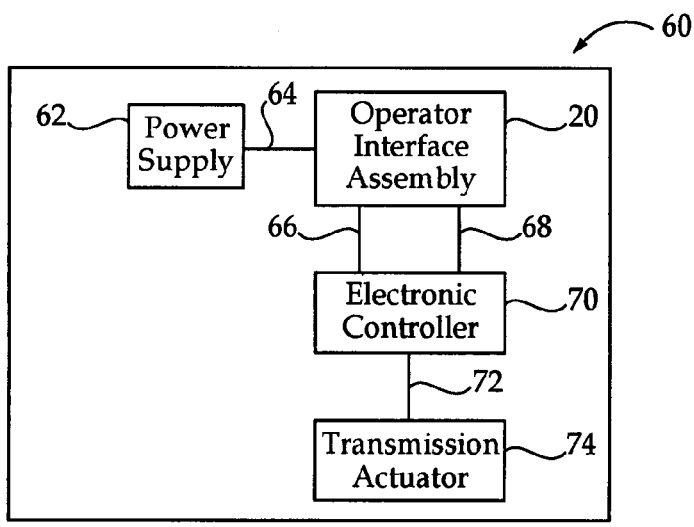
FIG. 3 is a simplified block diagram of a system incorporating the operator interface assembly of FIG. 2.

Referring to FIG. 3, a system incorporating the operator interface assembly 20 is shown generally at 60. The system 60 includes a power supply 62 for supplying a power or current through a port 64 to the Hall effect sensors 42 and 44 of the operator interface assembly 20. In response to movement of the magnet 32, a voltage of the power supplied to the Hall effect sensors 42 and 44 is altered. A first pulse width modulated signal 66 and a second pulse width modulated signal 68 are transmitted from the modulators 46 and 48, respectively, to an electronic controller, such as, for example, electronic control module (ECM) 70. The ECM 70 may include one or more built in power supplies and may, therefore, replace power supply 62 as the source of power for the operator interface assembly 20. The pulse width modulated signals 66 and 68 are evaluated or, more specifically, compared to determine the position of the lever 22. Once the position is determined, the ECM 70 generates an actuator command signal that is sent to an actuator, such as, for example, a transmission actuator 74, via an additional port, or communication line, 72. It may be desirable to configure the ECM 70 to not affect a movement of the transmission actuator 74 until a neutral position is initially determined.

The ECM 70 is of standard design and generally includes a processor, such as, for example, a central processing unit, a memory, and an input/output circuit that facilitates communication internal and external to the ECM. The central processing unit controls operation of the ECM 70 by executing operating instructions, such as, for example, programming code stored in memory, wherein operations may be initiated internally or externally to the ECM. A control scheme may be utilized that monitors outputs of systems or devices, such as, for example, sensors, such as Hall effect sensors 42 and 44, actuators, or control units, via the input/output circuit to control inputs to various other systems or devices. The ECM 70 may also be or include a dedicated circuit that operates in a manner consistent with a counterpart processor executing a specific set of instructions.

The memory may comprise temporary storage areas, such as, for example, cache, virtual memory, or random access memory, or permanent storage areas, such as, for example, read-only memory, removable drives, network/internet storage, hard drives, flash memory, memory sticks, or any other known volatile or non-volatile data storage devices located internally or externally to the ECM 70. One skilled in the art will appreciate that any computer-based system utilizing similar components is suitable for use with the present disclosure.

Figure 4:
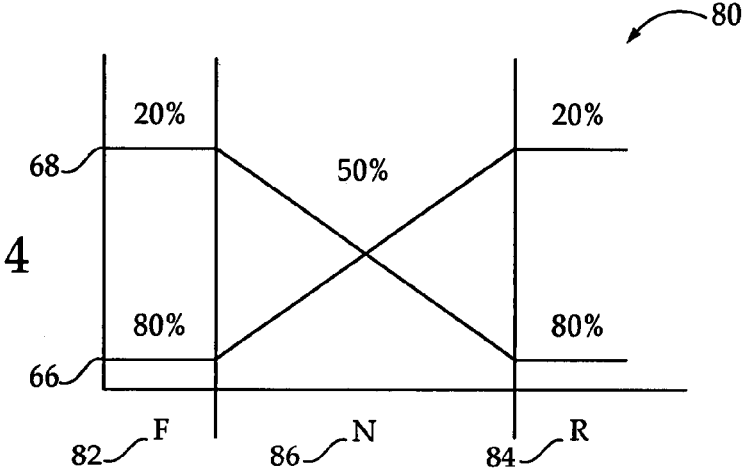
FIG. 4 is a diagram of duty cycles of signals received from the operator interface assembly of FIG. 2.

Turning now to FIG. 4, a diagram of duty cycles of the pulse width modulated signals 66 and 68 is shown generally at 80. The ECM 70 is configured to expect or anticipate certain duty cycle values from each pulse width modulated signal 66 and 68. For example, for a forward position 82, the ECM 70 may expect an 80%, or high, duty cycle from the first pulse width modulated signal 66 and a 20%, or low, duty cycle from the second pulse width modulated signal 68. For a reverse position 84, the ECM 70 may expect a 20% duty cycle from the first pulse width modulated signal 68 and an 80% duty cycle from the second pulse width modulated signal 66. A 50%, or moderate, duty cycle from each of the pulse width modulated signals 66 and 68 may be expect from the ECM 70 to determine a neutral position 86.

The ECM 70 may further be configured to provide for a margin of error. For example, a 10% margin of error may be provided for, wherein each expected value will be presumed if a value 10% lower than or 10% higher than the expected value is received. Therefore, according to this example, an expected value of 20% will now become an expected range of about 10% to about 30%, an expected value of 50% will become an expected range of about 40% to about 60%, and an expected value of 80% will become an expected range of about 70% to about 90%. Although expected values and ranges are provided, by way of example, it should be appreciated that the modulators 46 and 48 may be configured to provide, and the ECM 70 may be configured to expect, signals having alternative duty cycles.

INDUSTRIAL APPLICABILITY

Referring to FIGS. 1-5, a machine 10 typically includes an operator control station 12 and an operator interface or operator interface assembly 20, located within the operator control station, for controlling a direction of the machine. The operator interface assembly 20 includes a movable component, such as, for example a lever or directional controller 22. The lever 22 may be movable among three positions, such as a forward position, a reverse position, and a neutral position. Traditionally, the operator interface assembly is connected to the transmission of the machine through a mechanical linkage. More recently, however, contact type switches are being used to detect the selected gear position and use this position information to electronically facilitate a change in gear position.

In either arrangement, contact type switches are typically employed to detect the selected gear position of the shift lever and transmit the information to a controller of the machine. The controller of the machine may use this information for various purposes and may transmit the information to various subsystems of the machine. Contact switches, however, require physical contact to produce an electrical signal. Unfortunately, the contacts on these switches may become corroded or worn with use or, alternatively, the contacts may no longer form an acceptable electrical connection after repetitive use. Replacing such switches may be difficult and expensive, and may also require a significant period of downtime for the machine.

Figure 5:
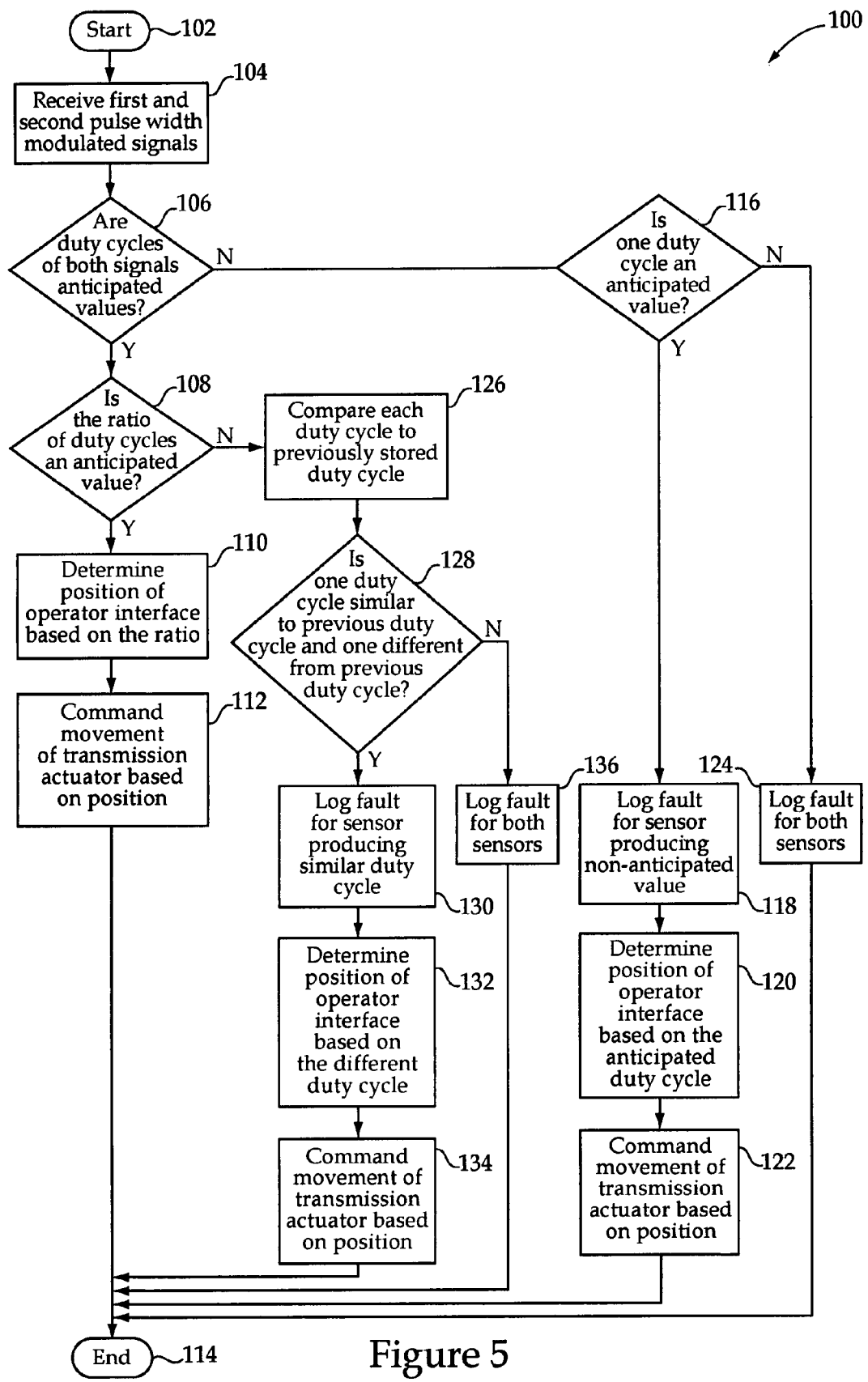
FIG. 5 is a flow chart of one embodiment of a method of actuating an actuator of the machine of FIG. 1.

Utilizing the operator interface assembly and method according to the present disclosure may help extend the durability and life expectancy of such switches or levers, and may provide an arrangement that is less vulnerable to electromagnetic interference, which may lead to incorrect position determinations. Turning to FIG. 5, there is shown a flow chart 100 representing an exemplary method of actuating an actuator of machine 10 utilizing the operator interface assembly 20. The method may be implemented in whole, or in part, by the ECM 70 of the system 60. The ECM 70 includes a computer usable medium having computer readable code thereon for implementing the method. The method may run continuously or may be initiated in response to movement of the operator interface assembly 20. The method begins at a START, Box 102. From Box 102, the method proceeds to Box 104, which includes the step of receiving the first and second pulse width modulated signals 66 and 68, respectively. Included in the step of receiving the signals 66 and 68 is a step of establishing a communication link with each of the Hall effect sensors 42 and 44. From Box 104, the method proceeds to Box 106 where the method determines if the duty cycles of both pulse width modulated signals 66 and 68 are expected or anticipated values. According to FIG. 4, expected values may be 20%, 50%, or 80%, and may further include a range that allows for a margin of error.

If expected values or, more specifically, ranges are received for duty cycles of both pulse width modulated signals 66 and 68, the method proceeds to Box 108. At Box 108 the ECM 70 determines if, although the values are both expected, the ratio of the expected values is correct. For example, both 20% and 50% are expected duty cycles. However, they do not represent an expected ratio, such as 4-1 (80%-20%), 1-4 (20%-80%), or 1-1 (50%-50%). Therefore, the method only proceeds to Box 110 if an expected ratio of expected values is received. At Box 110, the method determines the position of the operator interface assembly 20 or, more specifically, the lever or directional controller 22, based on the values of both pulse width modulated signals 66 and 68.

For example, if the duty cycle of the first pulse width modulated signal is 80% and the duty cycle of the second pulse width modulated signal is 20%, the ECM 70 determines that the values are expected and that the ratio of values is expected. Thereafter, the ECM 70 utilizes the information of diagram 80 to determine that the operator interface assembly 20 has been selected to represent the forward position. At Box 112 the ECM 70 uses this position information to command movement of the transmission actuator 74 via an actuator command. The duty cycles of each of the pulse width modulated signals 66 and 68 corresponding to the determined position are stored in a storage device, such as the memory of ECM 70. The method then proceeds to an END at Box 114.

If, however, at Box 106 the ECM 70 determines that the duty cycles of both pulse width modulated signals 66 and 68 are not expected values or ranges, the method proceeds to Box 116. At Box 116 the ECM 70 determines if exactly one of the pulse width modulated signals 66 and 68 has an expected duty cycle. If, for example, the second pulse width modulated signal 68 has an expected duty cycle of 80% and the first pulse width modulated signal 66 has a duty cycle of 5%, which is not expected, the method will continue to Box 118 where the ECM 70 will log a fault for the first Hall effect sensor 42 for producing a pulse width modulated signal having a duty cycle that is not expected. It should be appreciated that receiving no signal will be considered receiving an unexpected value.

After logging a fault, the method will proceed to Box 120 where the ECM 70 determines the position of the operator interface assembly 20 based on the value of the pulse width modulated signal having an expected duty cycle. According to the example used, a reverse position will be determined since the second pulse width modulated signal 68 has a duty cycle of 80%. At Box 122 the ECM 70 uses this position information to command movement of the transmission actuator 74 via an actuator command. The duty cycles of each of the pulse width modulated signals 66 and 68 corresponding to the determined position are stored in a storage device, such as the memory of ECM 70. The method then proceeds to the END at Box 114.

If, however, at Box 116 the ECM 70 determines that the duty cycles of neither pulse width modulated signals 66 and 68 are expected values or ranges, the method proceeds to Box 124. For example, the first pulse width modulated signal 66 may have a duty cycle of 35% and the second pulse width modulated signal 68 may have a duty cycle of 65%. At Box 124, the ECM 70 will log a fault for both Hall effect sensors 42 and 44. After logging a fault, the method will proceed to the END at Box 114.

If, however, at Box 108 the ECM 70 has determined that the duty cycles of both pulse width modulated signals 66 and 68 are expected values, but the ratio of the values is not expected, the method proceeds to Box 126. It should be appreciated that an unexpected ratio indicates that the duty cycle of one of the two pulse width modulated signals 66 and 68 has an unexpected value. At Box 126 the duty cycles of each pulse width modulated signal 66 and 68 are compared to values stored in a storage device, such as the memory of ECM 70, for duty cycles of the previous determined position of the operator interface assembly 20. If, at Box 128, the ECM 70 determines that one duty cycle is similar to a previous value and one duty cycle is not, the method proceeds to Box 130.

For example, if the first pulse width modulated signal 66 has an expected duty cycle of 20% and the second pulse width modulated signal 68 has an expected duty cycle of 50%, the ECM 70 determines that the values are expected, but the ratio is not correct. The ECM 70 then looks at the duty cycle values stored in memory for the previous position. If the previous position was neutral and the duty cycle of both signals was 50%, the ECM 70 determines that the duty cycle of the first pulse width modulated signal 66 has changed and the duty cycle of the second pulse width modulated signal 68 has stayed the same.

The ECM 70 then logs a fault for the second Hall effect sensor 44 at Box 130 and the method continues to Box 132. At Box 132 the position of the operator interface assembly 20 is determined based on the duty cycle of the pulse width modulated signal that has changed. According to the current example, the duty cycle of the first pulse width modulated signal 66 will be used to determine a currently requested position of reverse. At Box 134 the ECM 70 uses this position information to command movement of the transmission actuator 74 via an actuator command. The duty cycles of each of the pulse width modulated signals 66 and 68 corresponding to the determined position are stored in a storage device, such as the memory of ECM 70. The method then proceeds to the END at Box 114.

If, however, at Box 128 the ECM 70 determines that either both duty cycles or neither duty cycles are similar to the duty cycles of the previous position, the method proceeds to Box 142, where the ECM 70 will log a fault for both Hall effect sensors 42 and 44. After logging a fault, the method will proceed to the END at Box 114.

The operator interface assembly and method of the present disclosure provide for contactless switching of positions of a directional controller utilizing two Hall effect sensors. If one of the Hall effect sensors fails, the method implemented by the ECM 70 logs a fault for the failing sensor and relies on output from the working sensor to determine the position of the directional controller. In addition, the system incorporates the use of pulse width modulated signals, which are less vulnerable to electromagnetic interference since the signal has a time based modulation rather than an amplitude based modulation.

It should be understood that the above description is intended for illustrative purposes only, and is not intended to limit the scope of the present invention in any way. Thus, those skilled in the art will appreciate that other aspects of the invention can be obtained from a study of the drawings, the disclosure and the appended claims.

What is claimed is:

1. A machine having an operator interface for requesting an action from an actuator of the machine, comprising:
a movable component of the operator interface, wherein the movable component is movable among at least two positions;
a magnet;
a Hall effect sensor;
wherein one of the magnet and the Hall effect sensor is positioned to move in response to movement of the movable component, and the other of the magnet and the Hall effect sensor has a stationary position relative to the movable component;
a pulse width modulator operably coupled to the Hall effect sensor for producing a first pulse width modulated signal, wherein the first pulse width modulated signal is altered in response to movement of one of the Hall effect sensor and the magnet relative to the other; and
an electronic controller in communication with the pulse width modulator and the actuator, wherein the electronic controller is configured to actuate the actuator in response to evaluation of whether the first pulse width modulated signal is within a predetermined range of an expected pulse width modulated signal, and configured to log a fault if the first pulse width modulated signal is outside the predetermined range.

2. The machine of claim 1, wherein the pulse width modulator includes an oscillator and a comparator.

3. The machine of claim 1, wherein the movable component is movable among three positions.

4. The machine of claim 3, wherein the movable component is a machine directional controller movable between forward, neutral, and reverse positions.

5. The machine of claim 4, wherein the magnet is positioned to move in response to movement of the machine directional controller.

6. The machine of claim 5, wherein the Hall effect sensor is a first Hall effect sensor and is positioned a predetermined distance from a second Hall effect sensor.

7. A machine having an operator interface for requesting an action from an actuator of the machine, comprising:
a movable component of the operator interface, wherein the movable component is movable among at least two positions;
a magnet;
a Hall effect sensor;
wherein one of the magnet and the Hall effect sensor is positioned to move in response to movement of the movable component, and the other of the magnet and the Hall effect sensor has a stationary position relative to the movable component;
a pulse width modulator operably coupled to the Hall effect sensor for producing a first pulse width modulated signal, wherein the first pulse width modulated signal is altered in response to movement of one of the Hall effect sensor and the magnet relative to the other;
an electronic controller in communication with the pulse width modulator and the actuator, wherein the electronic controller is configured to actuate the actuator in response to evaluation of the first pulse width modulated signal;
wherein the movable component is movable among three positions;
wherein the movable component is a machine directional controller movable between forward, neutral, and reverse positions;
wherein the magnet is positioned to move in response to movement of the machine directional controller;
wherein the Hall effect sensor is a first Hall effect sensor and is positioned a predetermined distance from a second Hall effect sensor; and
a pulse width modulator operably coupled to the second Hall effect sensor for producing a second pulse width modulated signal, wherein the second pulse width modulated signal is altered in response to movement of the magnet relative to the second Hall effect sensor.

8. The machine of claim 7, wherein movement of the machine directional controller to the forward position results in the first pulse width modulated signal having a high duty cycle and the second pulse width modulated signal having a low duty cycle, and movement of the machine directional controller to the reverse position results in the second pulse width modulated signal having a high duty cycle and the first pulse width modulated signal having a low duty cycle.

9. The machine of claim 8, wherein movement of the machine directional controller to the neutral position results in the first pulse width modulated signal and the second pulse width modulated signal having moderate duty cycles.

10. The machine of claim 9, wherein the electronic controller is further configured to compare the duty cycle of the first pulse width modulated signal to the duty cycle of the second pulse width modulated signal to determine the position of the machine directional controller.

11. A method of actuating an actuator of a machine, comprising:
moving a movable component of an operator interface of the machine to
one of a first position and a second position, wherein one of a magnet and a Hall effect sensor is positioned to move with respect to the other of the magnet and the Hall effect sensor in response to movement of the movable component;
modulating a signal of the Hall effect sensor to produce a first pulse width modulated signal, wherein the signal is altered in response to movement of one of the Hall effect sensor and the magnet relative to the other;
transmitting the first pulse width modulated signal to an electronic controller of the machine;
determining the position of the movable component based on the first pulse width modulated signal at least in part by determining whether the first pulse width modulated signal is within a predetermined range of an expected pulse modulated signal; and
generating an actuator command signal from the electronic controller to the actuator based on the determined position.

12. The method of claim 11, further including moving a machine directional controller to one of the first position, the second position, and a third position; and
logging a fault if the first pulse width modulated signal is outside the predetermined range.

13. The method of claim 12, further including moving the magnet in response to movement of the machine directional controller, wherein the Hall effect sensor is a first Hall effect sensor and the magnet is moved relative to the first Hall effect sensor and a second Hall effect sensor.

14. A method of actuating an actuator of a machine, comprising:
moving a movable component of an operator interface of the machine to
one of a first position and a second position, wherein one of a magnet and a Hall effect sensor is positioned to move with respect to the other of the magnet and the Hall effect sensor in response to movement of the movable component;
modulating a signal of the Hall effect sensor to produce a first pulse width modulated signal, wherein the signal is altered in response to movement of one of the Hall effect sensor and the magnet relative to the other;
transmitting the first pulse width modulated signal to an electronic controller of the machine;
determining the position of the movable component based on the first pulse width modulated signal;
generating an actuator command signal from the electronic controller to the actuator based on the determined position;
moving a machine directional controller to one of the first position, the second position, and a third position;
moving the magnet in response to movement of the machine directional controller, wherein the Hall effect sensor is a first Hall effect sensor and the magnet is moved relative to the first Hall effect sensor and a second Hall effect sensor;
modulating a signal of the second Hall effect sensor to produce a second pulse width modulated signal, wherein the signal is altered in response to movement of the magnet relative to the second Hall effect sensor;
transmitting the second pulse width modulated signal to an electronic controller of the machine; and
determining the position of the movable component based on the first pulse width modulated signal and the second pulse width modulated signal.

15. The method of claim 14, further including comparing a duty cycle of the first pulse width modulated signal to a duty cycle of the second pulse width modulated signal to determine the position of the directional controller.

16. The method of claim 15, further including actuating a transmission actuator of the machine based on the determined position.

17. An operator interface assembly for actuating an actuator of a machine, comprising:
a first port for supplying power to the operator interface assembly;
a movable component of the operator interface, wherein the movable component is movable among at least two positions;
a magnet;
a first Hall effect sensor and a second Hall effect sensor;
wherein one of the magnet and the first and second Hall effect sensors is positioned to move in response to movement of the movable component, and the other of the magnet and the first and second Hall effect sensors has a stationary position relative to the movable component;
at least one pulse width modulator operably coupled to the first Hall effect sensor and the second Hall effect sensor for producing a first pulse width modulated signal and a second pulse width modulated signal, wherein each the first pulse width modulated signal and the second pulse width modulated signal is altered in response to movement of one of the first and second Hall effect sensors and the magnet relative to the other; and
a second port for transmitting the pulse width modulated signal from the pulse width modulator to an electronic controller of the machine configured to log a fault responsive to an unexpected pulse width modulated signal.

18. The operator interface assembly of claim 17, wherein the actuator is a transmission actuator of the machine.

19. The operator interface assembly of claim 17, wherein the movable component is a machine directional controller movable between forward, neutral, and reverse positions.

20. The operator interface assembly of claim 19, wherein the magnet is positioned to move in response to movement of the machine directional controller, and the first Hall effect sensor is positioned a predetermined distance from the second Hall effect sensor.

* * * * *